(12) United States Patent
Yang et al.

(10) Patent No.: US 7,764,098 B2
(45) Date of Patent: *Jul. 27, 2010

(54) START UP CIRCUIT OF POWER CONVERTER

(75) Inventors: Ta-Yung Yang, Milpitas, CA (US);
Chih-Feng Huang, Jhubei (TW)

(73) Assignee: System General Corp., Taipei Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/448,853

(22) Filed: Jun. 8, 2006

(65) Prior Publication Data

US 2007/0285141 A1 Dec. 13, 2007

(51) Int. Cl.
*H02M 1/00* (2007.01)
*H03K 3/02* (2006.01)
(52) U.S. Cl. ............................ 327/198; 323/901; 363/49
(58) Field of Classification Search ................. 327/198; 323/901; 363/16, 21.04, 21.12, 49
See application file for complete search history.

(56) References Cited

U.S. PATENT DOCUMENTS

| 5,285,369 | A * | 2/1994 | Balakrishnan | 363/49 |
| 6,940,320 | B2 * | 9/2005 | Sukup et al. | 327/112 |
| 7,257,008 | B2 * | 8/2007 | Yang et al. | 363/21.12 |
| 7,333,351 | B2 * | 2/2008 | Disney | 363/21.1 |
| 7,443,702 | B2 * | 10/2008 | Yang et al. | 363/49 |
| 7,615,976 | B2 * | 11/2009 | Huang et al. | 323/273 |
| 2007/0236274 | A1 * | 10/2007 | Huang et al. | 327/427 |
| 2007/0236970 | A1 * | 10/2007 | Yang et al. | 363/49 |
| 2007/0247225 | A1 * | 10/2007 | Huang et al. | 330/111 |

* cited by examiner

*Primary Examiner*—Lincoln Donovan
*Assistant Examiner*—Patrick O'Neill
(74) *Attorney, Agent, or Firm*—Rosenberg, Klein & Lee

(57) ABSTRACT

A start up circuit of power converters is presented. It includes a first transistor, a resistive device, a second transistor, a third transistor and a diode. The first transistor is coupled to a voltage source. The third transistor is connected in serial with the first transistor to output a supply voltage to a control circuit of the power converter in response to the voltage source. The diode is connected from a transformer winding of the power converter to supply a further supply voltage to the control circuit of the power converter. The second transistor is coupled to control the first transistor and the third transistor in response to a control signal. The resistive device provides a bias voltage to turn on the first transistor and the third transistor when the second transistor is turned off. Once the second transistor is turned on, the third transistor is turned off and the first transistor is negative biased.

21 Claims, 4 Drawing Sheets

START UP CIRCUIT OF POWER CONVERTER

BACKGROUND OF THE INVENTION

1. Field of the Invention

The present invention relates to a start up circuit. More particularly, the present invention relates to a high voltage start up circuit for power converters.

2. Description of Related Art

FIG. 1 shows a circuit diagram of a traditional start up circuit, in which a voltage $V_D$ is required to provide a supply voltage to a control circuit 10 of a power converter. When power converter is switched on, the voltage $V_D$ is supplied from a voltage source $V_{IN}$ through a transistor 11. A drain terminal and a source terminal of the transistor 11 are coupled to the voltage source $V_{IN}$ and the control circuit 10 respectively. When the control circuit 10 starts to operate, a further supply voltage is provided by a transformer winding 16 through a diode 17 and a capacitor 18. After that, the transistor 11 will be turned off to save the power consumption. A transistor 12 is used to turn off the transistor 11. The transformer winding 16 is coupled to a ground and a terminal of the diode 17. The capacitor 18 is coupled between another terminal of the diode 17 and the ground. The capacitor 18 is further coupled to the control circuit 10. A resistor 15 is coupled from the drain terminal of the transistor 11 to a gate terminal of the transistor 11. The resistor 15 is used to provide a bias voltage to turn on the transistor 11.

A drain terminal and a source terminal of the transistor 12 are coupled to the gate terminal of the transistor 11 and the ground respectively. A gate terminal of the transistor 12 is coupled to an output terminal of an inverter 14. An input terminal of the inverter 14 receives a control signal $S_N$. The transistor 11 is turned off by the transistor 12 in response to the control signal $S_N$. The transistor 12 is controlled by the control signal $S_N$ through the inverter 14. The transistor 12 is turned on to switch off the transistor 11 in response to the disabling of the control signal $S_N$. However, when the transistor 12 is turned on, the resistor 15 will consume a power $P_R$, it is given by, $$P_R = \frac{V_{IN}^2}{R_{15}} \quad (1)$$

wherein $R_{15}$ is a resistance of the resistor 15.

The voltage source $V_{IN}$ is normally supplied from an AC power source. Through the rectification, the voltage of the voltage source $V_{IN}$ would be as high as $350V_{DC}$ when a high line voltage is applied. Therefore, a significant power loss will be produced at resistor 15. The resistor 15 in high resistance such as several mega ohms can be used to reduce the power loss. However such the resistor 15 in high resistance is not appropriate to be built into an integrated circuit. Therefore, it is desirable to develop a high efficiency start up circuit, especially to develop an integrated circuit for high voltage start up.

SUMMARY OF THE INVENTION

The present invention provides a start up circuit of power converters. It includes a first transistor, a resistive device, a second transistor, a third transistor and a diode. The first transistor has a negative-threshold voltage. The third transistor and the second transistor are positive-threshold voltage devices. The first transistor is coupled to input a voltage source. The third transistor is connected in serial with the first transistor to provide a supply voltage to a control circuit of the power converter. The diode is coupled from a transformer winding of the power converter to provide a further supply voltage to the control circuit of the power converter. The second transistor is coupled to control the first transistor and the third transistor in response to a control signal. The resistive device provides a bias voltage to turn on the third transistor and the first transistor when the second transistor is turned off. Once the second transistor is turned on, the third transistor is turned off and the first transistor is negative biased.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings.

DETAILED DESCRIPTION OF THE INVENTION

Figure 1:
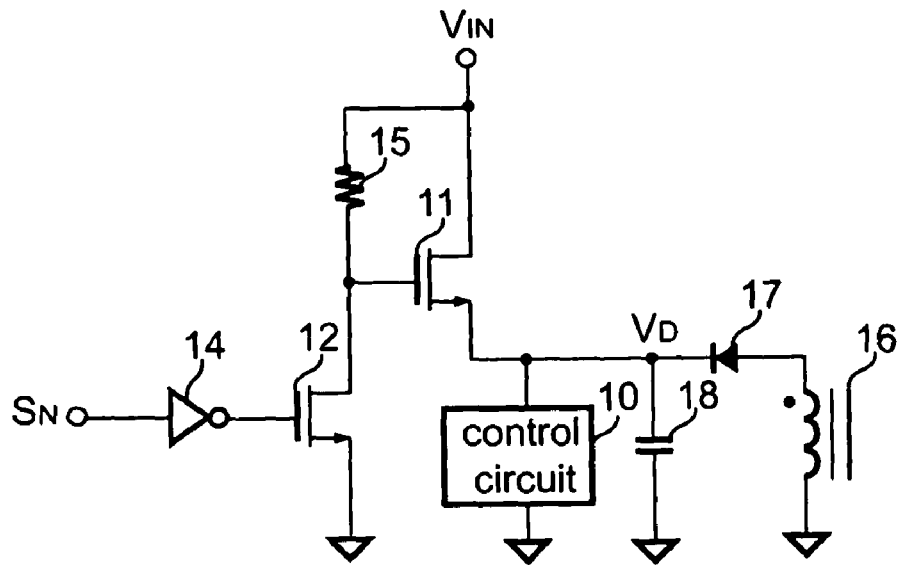
FIG. 1 shows a circuit diagram of a traditional start up circuit for power converters.
Figure 2:
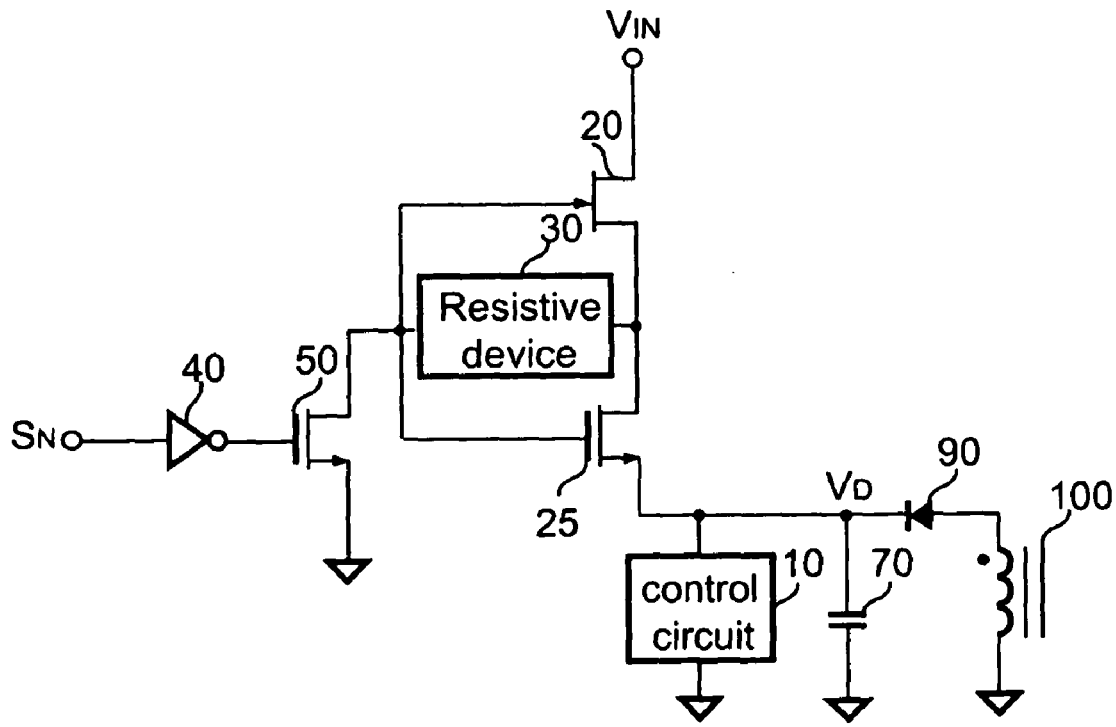
FIG. 2 shows a circuit diagram of a preferred embodiment of a start up circuit for power converters according to the present invention.

FIG. 2 shows a preferred embodiment of a start up circuit according to the present invention. It comprises a first transistor 20, a second transistor 50, a third transistor 25, a resistive device 30, and a diode 90. The first transistor 20 has a negative-threshold voltage, and therefore the first transistor 20 is a negative-threshold voltage device. Transistors 25 and 50 are positive-threshold voltage devices. The first transistor 20 has a first terminal, a second terminal and a third terminal. The first terminal of the first transistor 20 is connected to input a voltage source $V_{IN}$. The third transistor 25 is connected in serial with the first transistor 20 to output a voltage $V_D$ in response to the voltage source $V_{IN}$ to provide a supply voltage to the control circuit 10 of the power converter. A drain terminal of the third transistor 25 is connected to the second terminal of the first transistor 20. A source terminal of the third transistor 25 is coupled to the control circuit 10.

Figure 7:
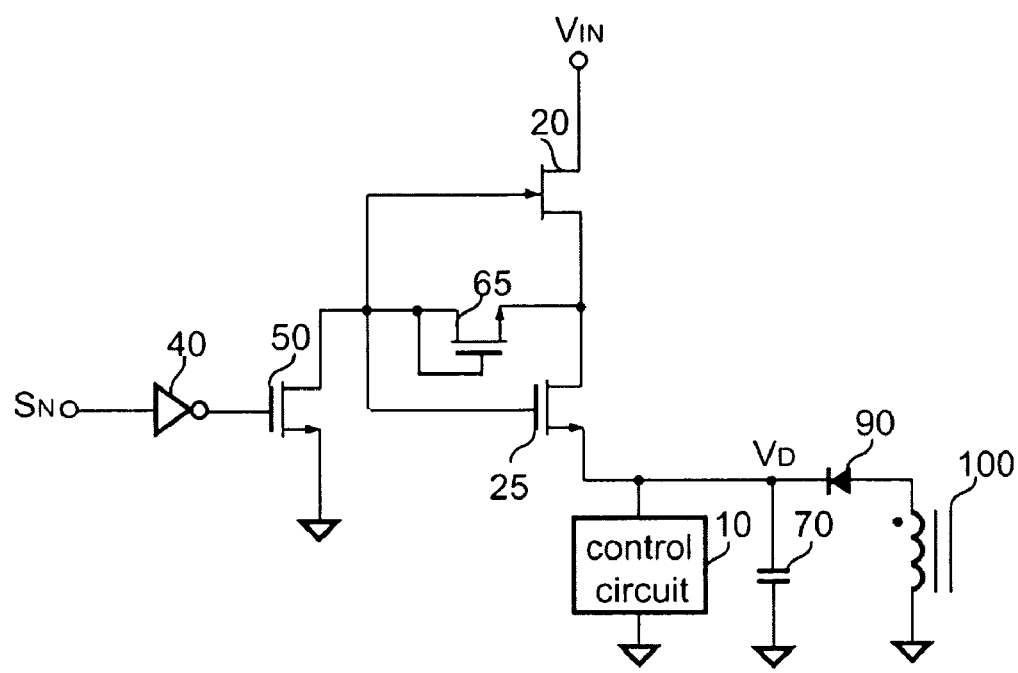
FIG. 7 shows a circuit diagram of another preferred embodiment of the start up circuit for power converters according to the present invention.

In order to turn on the first transistor 20 and the third transistor 25, the resistive device 30 is connected from the third terminal of the first transistor 20 to the second terminal of the first transistor 20. Additionally, the resistive device 30 is connected between the drain terminal and a gate terminal of the third transistor 25. The resistive device 30 therefore provides a bias voltage to the first transistor 20 and the third transistor 25. The resistive device 30 can be implemented by a resistor 60 (shown in FIG. 4) or a transistor 65 (shown in FIG. 7). A terminal of a capacitor 70 is coupled to the control circuit 10. Another terminal of the capacitor 70 is coupled to the ground. A terminal of the diode 90 is coupled to the capacitor 70 and the control circuit 10. Another terminal of the diode 90 is coupled to a transformer winding 100 of the power converter. When the control circuit 10 starts to operate, a further supply voltage is provided from the transformer winding 100 to the control circuit 10 through the diode 90 and the capacitor 70. After that, the voltage source $V_{IN}$ will be turned off via the first transistor 20 and the third transistor 25 to save the power consumption.

A control signal $S_N$ is connected to an input terminal of the start up circuit to turn on the second transistor 50 for turning off the voltage source $V_{IN}$. A gate terminal of the second transistor 50 is coupled to receive the control signal $S_N$ through an inverter 40. An input terminal of the inverter 40 is coupled to receive the control signal $S_N$. An output terminal of the inverter 40 is coupled to the gate terminal of the second transistor 50. A source terminal of the second transistor 50 is coupled to the ground. A drain terminal of the second transistor 50 is connected to the gate terminal of the third transistor 25 and the third terminal of the first transistor 20. Therefore the resistive device 30 provides the bias voltage to turn on the third transistor 25 and the first transistor 20 when the second transistor 50 is turned off in response to the enabling state of the control signal $S_N$.

Figure 3:
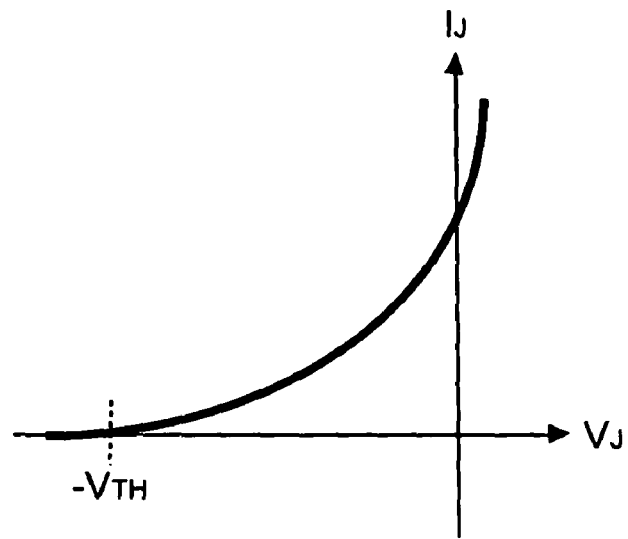
FIG. 3 shows a preferred voltage-to-current curve of a transistor with a negative-threshold voltage according the present invention.

Once the second transistor 50 is turned on after the control circuit 10 of the power converter starts to operate in response to the disabling state of the control signal $S_N$, the third transistor 25 is turned off to disable the voltage source $V_{IN}$ to the control circuit 10. Meanwhile, the resistive device 30 will provide a negative bias to the first transistor 20 that the second transistor 50 provides the negative bias to the first transistor 20 through the resistive device 30. The first transistor 20 includes the negative-threshold voltage $-V_{TH}$. FIG. 3 shows a preferred voltage-to-current curve of the first transistor 20. The current $I_J$ is the current flowed through the first terminal and the second terminal of the first transistor 20. The voltage $V_J$ is the voltage across the third terminal and the second terminal of the first transistor 20. The first transistor 20 is developed to operate as a voltage controlled resistance device. The current $I_J$ is decreased in response to the decrease of the voltage $V_J$. When the voltage $V_J$ is lower than the negative-threshold voltage $-V_{TH}$, the first transistor 20 will be turned off.

Figure 4:
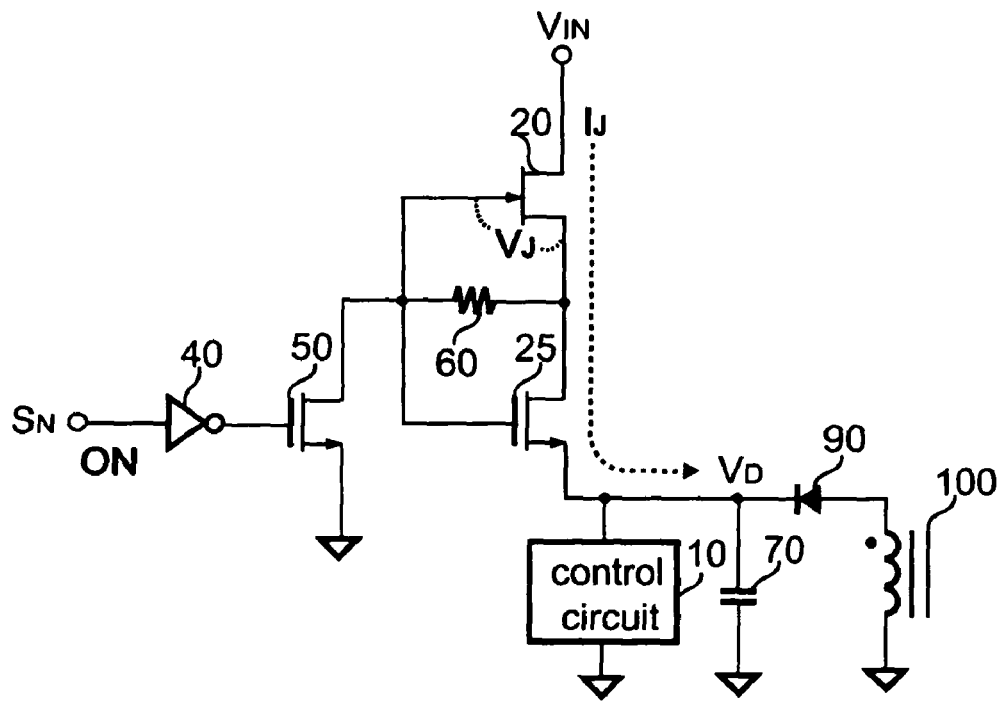
FIG. 4 shows the current flow as the start up circuit is turned on according to the present invention.
Figure 5:
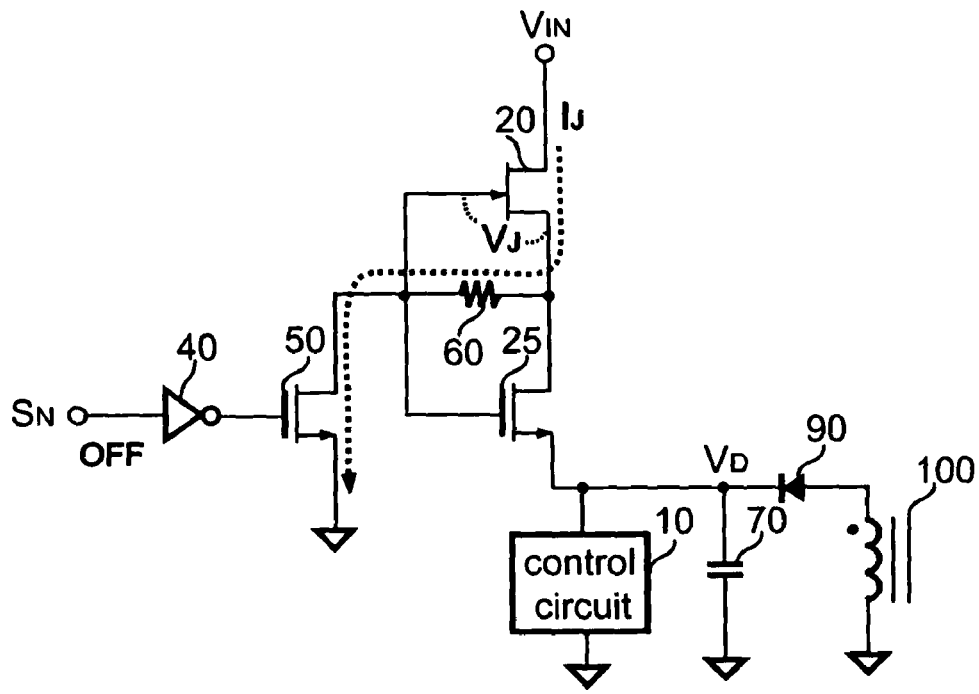
FIG. 5 shows the current flow as the start up circuit is turned off according to the present invention.

FIG. 4 and FIG. 5 respectively show the on stage and off stage of a preferred start up circuit, in which a resistor 60 is operated as the resistive device 30. In FIG. 4, the second transistor 50 is turned off in response to the enabling state of the control signal $S_N$. No current can be flowed through the resistor 60. The resistor 60 thus provides a zero bias to the voltage $V_J$ of the first transistor 20. The resistor 60 further provides a same bias voltage between the gate terminal and the drain terminal of the third transistor 25. Therefore, both first transistor 20 and third transistor 25 are turned on. In FIG. 5, the second transistor 50 is turned on to switch off the third transistor 25 in response to the disabling state of the control signal $S_N$. Meanwhile, the current flows through the second transistor 50 and the resistor 60 will provide the negative bias to the voltage $V_J$ of the first transistor 20. At this moment, the increase of the current $I_J$ provides further negative bias to the voltage $V_J$ for turning off the first transistor 20 and prevents the increase of the current $I_J$. The circuit is operated as a negative feedback. Although there is still has a current flowed through the first transistor 20 when the third transistor 25 is turned off, the current is small and negligible. The first transistor 20 and the resistive device 30 are appropriate to be built into an integrated circuit. Therefore, the start up circuit shown in FIG. 2 can achieve the objective of this invention.

Figure 6:
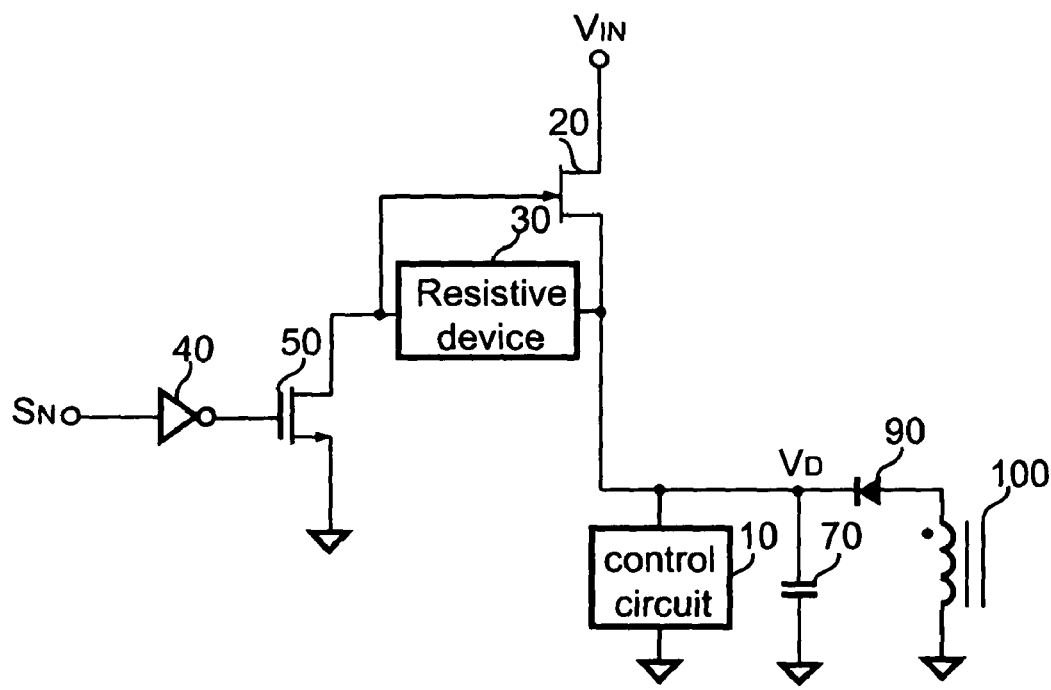
FIG. 6 shows a circuit diagram of another preferred embodiment of the start up circuit for power converters according to the present invention.

Furthermore, FIG. 6 shows another preferred embodiment of the start up circuit. The start up circuit does not include the third transistor 25 as shown in FIG. 2. The first transistor 20 coupled to receive the voltage source $V_{IN}$ for providing a supply voltage to the control circuit 10 of the power converter. Without the third transistor 25, a current will be flowed from the capacitor 70 to the second transistor 50 through the resistive device 30 when the second transistor 50 is turned on. Although the resistive device 30 will provide the negative bias to turn off the first transistor 20, the current outputted from the capacitor 70 causes a power loss. Therefore the resistive device 30 shown in FIG. 6 is required to have a high resistance to reduce the power consumption.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A start up circuit of power converter, comprising:
   a first transistor having a first terminal, a second terminal and a third terminal, in which the first terminal is coupled to receive a voltage source;
   a third transistor having a drain terminal, a source terminal and a gate terminal, in which the drain terminal of the third transistor is connected to the second terminal of the first transistor, the source terminal of the third transistor is coupled to provide a supply voltage to a control circuit of the power converter;
   a diode coupled from a transformer winding of the power converter to the control circuit of the power converter for providing a further supply voltage to the control circuit;
   a second transistor having a drain terminal, a source terminal and a gate terminal, in which the drain terminal of the second transistor is coupled to the gate terminal of the third transistor and the third terminal of the first transistor, the gate terminal of the second transistor is coupled to receive a control signal, and the source terminal of the second transistor is coupled to a ground; and
   a resistive device connected from the third terminal of the first transistor to the second terminal of the first transistor;
   wherein the resistive device provides a bias voltage to turn on the first transistor and the third transistor when the second transistor is turned off, the control signal is coupled to turn on the second transistor for switching off the third transistor, the third transistor and the second transistor being positive-threshold voltage devices.

2. The start up circuit of power converter as claimed in claim 1, wherein the first transistor is a negative-threshold voltage device.

3. The start up circuit of power converter as claimed in claim 1, wherein the resistive device provides a negative bias to the first transistor once the second transistor is turned on.

4. The start up circuit of power converter as claimed in claim 1, wherein the second transistor is turned on after the control circuit of the power converter starts to operate.

5. The start up circuit of power converter as claimed in claim 1, wherein the first transistor is a voltage controlled resistance device, the first transistor still has a current flow through the first transistor when the third transistor is turned off.

6. The start up circuit of power converter as claimed in claim 1, wherein the resistive device can be implemented by a resistor or a transistor.

7. A start up circuit of power converter comprising:
a first transistor coupled to receive a voltage source;
a third transistor connected in serial relation with the first transistor to provide a supply voltage to a control circuit of the power converter in response to the voltage source;
a resistive device coupled to the first transistor and the third transistor to provide a bias voltage to turn on the first transistor and the third transistor; and
a second transistor coupled to the third transistor to turn off the third transistor;
wherein a control signal is coupled to the second transistor to control the second transistor, the second transistor and the third transistor being positive-threshold devices.

8. The start up circuit of power converter as claimed in claim 7, wherein the first transistor is a negative-threshold voltage device.

9. The start up circuit of power converter as claimed in claim 7 further comprises a diode coupled from a transformer winding of the power converter to the control circuit of the power converter to provide a further supply voltage to the control circuit.

10. The start up circuit of power converter as claimed in claim 7, wherein the second transistor provides a negative bias to the first transistor through the resistive device.

11. The start up circuit of power converter as claimed in claim 7, wherein the first transistor is a voltage controlled resistance device, the first transistor still has a current flow through the first transistor when the third transistor is turned off.

12. The start up circuit of power converter as claimed in claim 7, wherein the resistive device can be implemented by a resistor or a transistor.

13. A start up circuit comprising:
a first transistor having a first terminal, a second terminal and a third terminal, the first terminal coupled to receive a voltage source and the second terminal providing a supply voltage to a control circuit of a power converter;
a resistive device connected from the third terminal of the first transistor to the second terminal of the first transistor and coupled to the supply voltage to provide a bias voltage to turn on the first transistor;
a second transistor coupled to the third terminal of the first transistor and the resistive device to turn off the first transistor; and
a diode coupled from a transformer winding of the power converter to the control circuit of the power converter for providing a further supply voltage to the control circuit;
wherein a control signal is coupled to the second transistor to control the second transistor.

14. The start up circuit as claimed in claim 13, wherein the second transistor is turned on after the control circuit of the power converter starts to operate.

15. The start up circuit as claimed in claim 13, wherein the first transistor is a negative-threshold voltage device.

16. The start up circuit as claimed in claim 13, wherein the second transistor provides a negative bias to the first transistor through the resistive device to turn off the first transistor.

17. A start up circuit comprising:
a first transistor having a first terminal, a second terminal and a third terminal, the first terminal coupled to receive a voltage source and the second terminal providing a supply voltage to a control circuit of a power converter;
a resistive device connected from the third terminal of the first transistor to the second terminal of the first transistor and coupled to the supply voltage to provide a bias voltage to turn on the first transistor; and
a second transistor coupled to the third terminal of the first transistor and the resistive device to turn off the first transistor;
wherein a control signal is coupled to the second transistor to control the second transistor.

18. The start up circuit as claimed in claim 17 further comprises a diode coupled from a transformer winding of the power converter to the control circuit of the power converter to provide a further supply voltage to the control circuit.

19. The start up circuit as claimed in claim 17, wherein the second transistor is turned on after the control circuit of the power converter starts to operate.

20. The start up circuit as claimed in claim 17, wherein the first transistor is a negative-threshold voltage device.

21. The start up circuit as claimed in claim 17, wherein the second transistor provides a negative bias to the first transistor through the resistive device to turn off the first transistor.

* * * * *